United States Patent [19]
Saida et al.

[11] Patent Number: 5,718,039
[45] Date of Patent: Feb. 17, 1998

[54] METHOD OF MAKING MULTILAYER PRINTED WIRING BOARD

[75] Inventors: Muneo Saida, Tokyo; Muneharu Ohara, Hasuda; Teturoh Satoh, Ageo, all of Japan

[73] Assignee: Mitsui Mining & Smelting Co., Ltd., Tokyo, Japan

[21] Appl. No.: 516,480

[22] Filed: Aug. 17, 1995

[30] Foreign Application Priority Data

Jan. 23, 1995 [JP] Japan ................... 7-025809

[51] Int. Cl.⁶ .................................. H05K 3/02
[52] U.S. Cl. ................... 29/846; 29/830; 174/258
[58] Field of Search ............. 29/830, 846; 174/255, 174/258, 259

[56] References Cited

U.S. PATENT DOCUMENTS

| | | |
|---|---|---|
| 3,932,689 | 1/1976 | Watanabe et al. |
| 4,804,575 | 2/1989 | Kohm. |
| 5,120,384 | 6/1992 | Yoshimitsu et al. ........... 29/830 X |
| 5,153,987 | 10/1992 | Takahashi et al.. |
| 5,179,777 | 1/1993 | Suzuki ........................... 29/830 X |
| 5,220,723 | 6/1993 | Okaka ............................ 29/830 |
| 5,318,651 | 6/1994 | Matsui et al. ................... 29/830 X |

FOREIGN PATENT DOCUMENTS 3-285 391  12/1991  Japan ......................... 29/830

*Primary Examiner*—Carl J. Arbes
*Attorney, Agent, or Firm*—Morrison Law Firm

[57] ABSTRACT

A process for preparing said multilayer printed wiring board comprising the steps of (1) adhering copper foils respectively to both the faces of a substrate, masking and etching said foils in a usual way to form circuits, (2) applying copper foils having a semi-cured insulating layer formed on one face thereof respectively to said circuits with the insulating layer facing to said circuit, the insulating layers being as defined above, and then pressing the whole together under heat and (3) masking and etching the copper foils with the insulating layer thereon in a usual way to form circuits, the steps (2) and (3) being repeated as many times as desired.

2 Claims, 1 Drawing Sheet

METHOD OF MAKING MULTILAYER PRINTED WIRING BOARD

BACKGROUND OF THE INVENTION

1. Field of the Invention

This invention relates to a multilayer printed wiring board for use in making electronic circuits and a process for manufacturing said wiring board.

2. Prior Art

A printed wiring board for use in making electronic circuits has heretofore been manufactured by impregnating a glass cloth with a thermosetting resin such as an epoxy resin and then making the thus impregnated resin semi-cured to obtain a prepreg, placing one copper foil facing to one side of the thus obtained prepreg and another copper foil facing to the other side thereof, pressing the whole together under pressure and heat by the use of a press to prepare a copper foil-applied laminate, and then subjecting to thus prepared laminate to circuit formation by etching and to perforation.

In this case, there is used a copper foil which has been subjected to so-called unevenness or roughnss formation at one face of the copper foil in order to ensure secure adhesion of the copper foil to the prepreg.

The above copper foil-applied laminate is etched so as to form circuits respectively on both the sides of the laminate thereby to fabricate an inner-layer member. Copper foils are further adhered via the prepregs onto both the sides of the inner-layer member, respectively, and then etched to form outer-layer circuits whereby a multilayer printed wiring board is also manufactured as illustrated in FIG. 1 which is a schematic cross-sectional view of a multilayer printed wiring board having two inner circuits and two outer circuits.

In this case, the inner layer circuits (copper foils) formed in the inner layer member will not fully be adhered to the prepregs of the outer layer member since the exposed surfaces of the inner circuits are smooth surfaces (which are called "glossy face"). Thus, it is a common practice that the surface of the circuits (copper foils) of the inner layer member is subjected to black oxide treatment to ensure the secure adhesion of the inner layer member to the outer layer member and then a multilayer board is fabricated. The adhesiveness of the surface of the inner-layer circuits (copper foils) formed in the inner-layer member respectively to the prepregs of the outer-layer member in greatly enhanced by the black oxide treatment and, thus, the heat resistance and moisture resistance of the resulting multilayer printed wiring board will amount to a practically satisfiable level. The multilayer printed wiring boards produced by the above method have been used in various fields such as electrical and electronic fields.

Although the adhesion of the inner-layer circuits (copper foils) formed in the inner-layer member respectively to the prepregs of the outer-layer member is improved, various problems are raised in other aspects. According to "Technical Manual of Printed Circuits", p.261, published by Nikkan Kogyo Newspaper Publishing Co., the various problems include the oxide film is dissolved in hydrochloric acid or the like whereby haloing phenomena are presented and the insulation proparties and inter-layer connection reliability are apt to be decreased. The problems also include difficulties in grinding or polishing thin inner-layer circuits (copper foils) and operational difficulties due to the use of a concentrated alkaline solution or the like for the black oxide treatment.

To solve these problems, another method such as one described in, for example, Japanese Patent Gazette No. Hei 4-19306 (or No. 19806/92) has been proposed as a substitute for the black oxide treatment; however, this substitute dose not come to be widely used since it needs specific chemicals and the like. As a method which dispenses with black oxide treatment, there is also known a method using so-called double-treat copper foils both the faces of which have been subjected to toughening treatment. The double-treat copper foils are not generally used since they need a complicated process for being produced, incur a higher cost and raise problem such as insufficient peeling-off of the photoresist therefrom at the time of formation of circuits due to close adhesion of a photoresist to the copper foils.

SUMMARY OF THE INVENTION

The object of this invention is to solve the problems involved in the above black oxide treatment and also to provide a multilayer printed wiring board having high electrical properties, heat resistance and the like as well as a process for producing said wiring board.

The above object may be achieved by providing an insulation layer having a specific composition without subjecting the copper foils (inner-layer circuits) to black oxide treatment.

This invention resides in a multilayer printed wiring board prepared by providing both the faces of a substrate (prepreg for example) respectively with circuits, providing via insulating layers on the outsides of said circuits respectively with circuits and then repeating such provision on the outsides as above, characterized in that said insulating layers comprise 40–70 wt. % of an epoxy resin, 20–50 wt. % of a polyvinyl acetal resin and 0.1–20 wt. % of a melamine resin or urethane resin, each based on the total amount of the resin components, with the proviso that 50–80 wt. % of said epoxy resin is a rubber-modified epoxy resin.

The multilayer printed wiring board of this invention is characterized by using the insulating layers without subjecting the circuits (copper foils) provided respectively on both the faces of the substrate to black oxide treatment.

The epoxy resin used in the above insulating layer may be such that it is a commercially available one for use in laminates and molding electronic elements. These commercially available resins may be used without any specific limitation. The epoxy resins so used include a bisphenol A-type epoxy resin, bisphenol F-type resin, novolak-type epoxy resin, o-cresol novolak-type epoxy resin, glycidyl amine compounds such as triglycidyl isocyanurate and N, N-diglycidyl aniline, and brominated epoxy resins such as tetrabromo-bisphenol A diglycidyl ether. These epoxy resins may be used singly or jointly. Further, they are not particularly limited in polymerization degree and epoxy equivalent as epoxy resins.

The curing agents for use in the epoxy resins preferably include generally known latent curing agents such as dicyandiamide, organic hydrozide and imidazole, and a phenol novolak resin which is difficultly curable at normal temperature.

The optimum amounts of these curing agents added to the respective epoxy resins are known and, however, the amounts added may be varied as far as the curing agents maintain their effects as curing agents. Further, these curing agents may be used singly or jointly. Epoxy resin cure accelerators such as a tertiary amine may preferably be additionally used.

The amount of the epoxy resin used in said insulating layer is 40–70% by weight of the total of the resin ingredients. If the amount used is less then 40 wt. % then the resulting printed wiring board will be deteriorated in electrical properties and heat resistance, while if the amount used exceeds 70 wt.% then the resin will run too much from the insulating layer by using a press at the time of the formation of a multilayer whereby adhesiveness between the circuits and insulating layers and insulating property thereof are lowered.

The rubber-modified epoxy resins used as a part of the epoxy resins which constitute the insulating layer in this invention may be commercially available ones for use as adhesiveness or paints, and these commercially available ones may be used without any particular limitations. They are illustrated by "EPICION TSR-960" (tradename and produced by Dai Nippon Ink Mfg. Co.), "EPOTOHTO YR-102" (tradename and produced by Tohto Kasei Co.), "SUMIEPOXY ESC-500" (tradename and produced by Sumitomo Chemical Co.) and "EPOMIK VSR 3531" (tradename and produced by Mitsui Petrochemicals Co.). These rubber-modified epoxy resins may be used singly or jointly. The amount of the rubber-modified epoxy resins used herein is 5–80% by weight of the total of the epoxy resins. The adhesion of the insulating layer to the surface of the circuits (copper foils) which are not subjected to black oxide treatment is remarkably improved in adhesiveness by the use of the rubber-modified epoxy resin in the insulating layer. If, however, the amount used is less than 5 wt. % then an improvement in adhesiveness will not be made, while the amount used is 80 wt. % then the insulating layer will be lowered in heat resistance.

The polyvinyl acetal resin used in the insulating layer according to this invention may be a resin which is synthesized by reacting a polyvinyl alcohol with an aldehyde. At the present, reaction products obtained by the reaction of polyvinyl alcohols having various polymerization degrees with at least one or more kinds of aldehydes, are marketed as polyvinyl acetal resins for use in paints and adhesives and, however, the polyvinyl acetal resin may be used in this invention irrespective particularly of the kinds of aldehydes and degree of acetalization. Although the degree of polyacriozation of polyvinyl alcohol as a starting material is not particularly limited, it is preferably in the range of 2000–3500 in view of the solubility to solvents and heat resistance of the resulting insulating layer. Further, modified polyvinyl acetals into the molecular or which carboxyl group or the like has been introduced are also commercially available and they may be used without any particular limitation if they raise no problems as to compatibility with epoxy resins. The amount of the polyvinyl acetal resins used is 20–50% by weight of the total of the resin ingredients. If the amount use is less than 20 wt.% then the aforementioned improvements in the run of the epoxy resin from the insulating layer are not made, while if the amount used exceeds 50 wt. % then the resulting cured insulating layer will increase in water absorptivity whereby the printed wiring board is deteriorated in waterproofing as such.

The adhesive used in this invention is, in addition to the above ingredient, incorporated with a melamine resin or a urethane resin as a crosslinking agent for the above polyvinyl acetal resin.

The melamine resin used herein may be a commercially available alkyl-etherified (alkylated) melanime resin for use for paints. Such a commercially available melamine is illustrated by a methylated melamine resin, n-butylated melamine resin, iso-butylated melamine resin or mixed alkylated melamine resin. The molecular weight and the alkylation degree of these melamine resins are not particularly restricted.

The urethane resins used in this invention include resins which contain isocyanate groups in the molecule and are commercially available for use for adhesives and paints. They are illustrated by reaction products of polyisocyanate compounds such as tolylene diisocyanate, diphenylmethane diisocyanate and polymethylenepolyphenyl polyisocyanate, with polyols such as trimethylalpropane, polyetherpolyol and polyesterpolyol. These reaction products (resins) are very reactive as resins and may be polymerlied in the presence of atmospheric moisture in some cases and, therefore, it is preferable that these resins be stabilized with a phenol or oxime to prepare urethane resins called block isocyanates, for use in this invention.

The amount of a melamine resin or urethan resin incorporated in the insulating layer of this invention is 0.1–20% by weight of the total of the resin ingredients. If the amount used is less than 0.1 wt. % then the polyvinyl acetal resin will not fully be crosslinked thereby the resulting insulating layer is detoriorated in heat resistance, while if the amount used is more than 20 wt. % then adhesiveness of the resulting insulating layer to copper foils having not been subjected to surface toughening will be lowered.

In the preparation of the insulating layers, there may be used as required inorganic fillers typified by talc and aluminum hydroxide as well as an anti-foaming agent, a levelling agent, a coupling agent and the like, in addition to the aforementioned essential ingredients. The above optional ingredients are effective to improve the resulting insulating layer in levelness and smoothness, enhance the fire-retardation of the layer and lower a cost for the preparation of the layer.

A process for a multilayer printed wiring board of this invention will be explained hereunder.

This invention resides in a multilayer printed wiring board and a process for the preparation thereof which comprises:

(1) a step of adhering copper foils respectively to both the faces of a substrate, masking the copper foils at predetermined portions of the non-adhesive faces thereof and then etching the partly masked copper foils to form circuits thereon, (2) a step of applying copper foils having a semi-cured insulating layer formed on one face of the respective copper foils, the insulating layer comprising 40–70 wt. % of an epoxy resin and a curing agent therefor and 20–50 wt. % of a polyvinyl acetal resin and 0.1–20 wt. % of a melamine resin or urethane resin, each based on the total of the resin ingredients with the proviso that 5–80% by weight of said epoxy resin is a rubber-modified epoxy resin, facing the insulating layer respectively to said circuits formed on both the faces of the substrate, and then pressing the whole together under heat thereby to cure the insulating layers and simultaneously laminate the insulating layers respectively with said circuits formed on both the faces of the substrate and (3) a step of masking the predetermined portions of the copper foils respectively laminated via the insulating layers with said circuits and then etching the partly masked copper foils to form circuits respectively on the insulating layers.

Further, according to this invention, the above-mentioned steps (2) and (3) may be repeated as many times as desired to increase layers.

An ordinary method comprises the steps of adhering copper foils respectively to both the faces of a substrate such as an epoxy-impregnated glass cloth prepreg, masking predetermined portions of the non-adhesive face (which is not adhered to the substrate) of copper foils with a photoresist or the like and then etching the partly masked copper foils to obtain predetermined circuits. The circuits (copper foils) so obtained are hitherto subjected to black oxide treatment and, however, such black oxide treatment is not carried out in this invention.

In general, inner-layer circuits are freed from foreign matters located on the surface of the circuits and attachments formed thereon at the time of pressing by use of the steps of washing and degreasing, and thereafter subjected to black oxide treatment. In this invention, a washing step and a degreasing step are basically not necessary and, however, these steps may be carried out if necessary depending on the state of the inner-layer circuits. Further, the material for the inner-layer circuit board and the thickness of copper foils of the inner-layer circuits are not particularly limited as far as said circuit board and copper foils are such that they are now used in a multilayer printed wiring board.

According to this invention, copper foils having a semi-cured insulating layer on one face thereof are applied respectively to circuits (copper foils) formed on both the faces of a substrate with the semi-cured insulating layer facing to the substrate, the semi-cured insulating layer comprising 40–70 wt. % of an epoxy resin and a curing agent therefor, 20–50 wt. % of a polyvinyl acetal resin and 0.1–20 wt. % of a melamine or urethane resin, each based on the total of the resin ingredients, with the proviso that 5–80 wt. % of the epoxy resin is a rubber-modified epoxy resin, the whole is then pressed together under heat thereby to cure the semi-cured insulating layers and simultaneously laminate the insulating layers respectively with the circuits formed on both the faces of the substrate.

The copper foil having a semi-cured insulating layer on one face thereof (semi-cured insulating layer-applied copper foil) is prepared by coating a copper foil on one face thereof with a resin varnish obtained by dissolving the aforementioned resin ingredients in an industrially inexpensive general-purpose solvent such as methyl ethyl ketone or toluene, drying the coated resin varnish and then semi-curing (partly curing) the dried varnish.

The copper foils used herein include a rolled copper foil and an electrolytic copper foil and have a thickness of preferably 9–100 μm, more preferably 12–35 μm. The surface treatment and rust preventive treatment of the copper foil are not particularly restricted. There are no particular limits to the thickness of the insulating layer and, however, it is desirable that the insulating layer be at least 50 μm in thickness after semi-cured in view of necessity to ensure insulation resistance between layers, loss in thickness due to pressing, and the like. There are set no particular limits to the thickness of the insulating layer. If, however, the insulating layer is made thicker than is required, then the resin may run from the end of the insulating layer at the time of pressing. Thus, it is preferable that the insulating layer be about 500 μm or less in thickness.

According to this invention, a multilayer printed wiring board can be produced without subjecting the circuits formed on the inner-layer member to black oxide treatment by using insulating layers having a specific composition.

While the multilayer printed wiring board of this invention maintains electrical properties and heat resistance equal to those of a conventional one, various problems as to the black oxide treatment can be solved. The conditions for lamination at this invention do not require any change of the conventional conditions. This invention is also advantageous in that the unevenness and migration on the surface of a multilayer printed wiring board are avoided since fibers such as glass cloth are not used in insulating layers between the inner-layer circuits and other circuits such as the outer-layer circuits. A process for fabricating a multilayer printed wiring board by the use of insulating layer-applied copper foils in which the copper foil and the insulating layer are integrated, is illustrated in "Printed Circuit World Convention VI" T9. The process of this invention, however, is different from the above illustrated process in that the insulating layer according to this invention is uniform and tack-free at room temperature and in the form of being semi-cured without need of a protective film thereby to dispense with a step of peeling the protective film, this making the process according to this invention industrially more advantageous.

DESCRIPTION OF THE PREFERRED EMBODIMENTS

Figure 1:
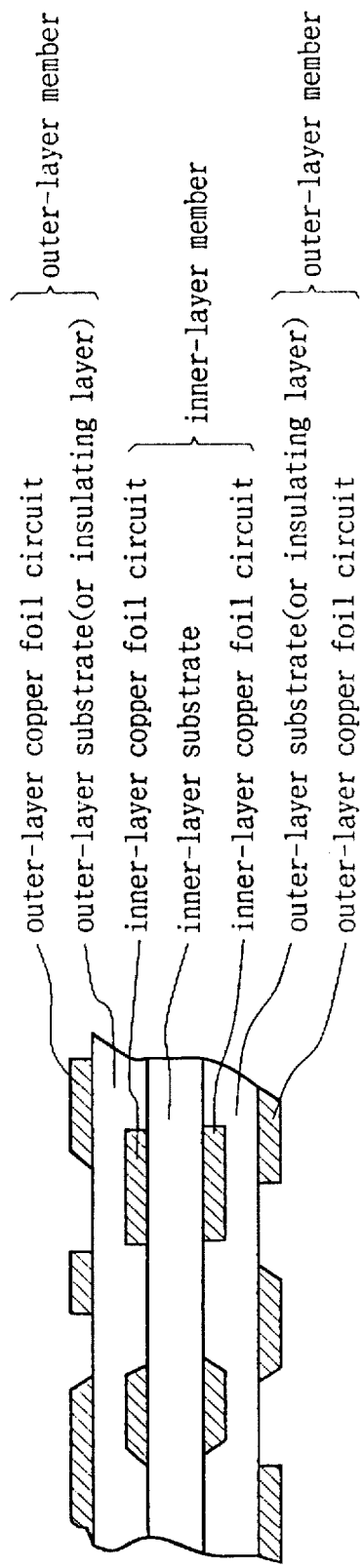
FIG. 1 is a schematic cross-sectional view of an embodiment of a conventional multilayer printed wiring board having glass cloth prepreg substrate therein or a novel one of this invention having insulating layers therein.

This invention will be better understood by the following Examples and Comparative Examples wherein epoxy resins which are not modified with rubber are simply called "epoxy resins", while epoxy resins which have been modified with rubber are called "rubber-modified epoxy resins".

EXAMPLE 1

(1) Preparation of an inner-layer member

35 μm-thick electrolytic foils one face of each of which has been subjected to toughening treatment were applied respectively to both the faces of a substrate consisting of 8 sheets of a commercially available 0.1 mm-thick epoxy resin-impregnated glass cloth prepreg, the 8 sheets being placed one upon another, with the toughened face of the copper foil facing to the substrate as shown in FIG. 1, after which the whole was pressed together at a pressure of 30 kgf/cm$^2$ and a temperature of 170° C. for 60 minutes to prepare an inner-layer member wherein the copper foil has been applied to each face of the substrate thereby to form a laminate. Both the faces (copper foils) of the thus formed laminate were masked at their predetermined portions and then etched by an ordinary method to form circuits.

(2) Preparation of insulating layer-applied copper foils

In a 1:1 toluene/methanol mixed solvent were dissolved 40 parts by weight of an epoxy resin (tradename, EPOMIC R-301, produced by Mitsui Petrochemicals Co.), 20 parts by weight of a rubber modified epoxy resin (tradename, EPO-TOHTO YR-102, produced by Tohto Kasei Co.), 30 parts by weight of a polyvinyl acetal resin (tradename, DENKA BUTYRAL No. 5000A, produced by Denki Kagaku Kogyo Co.), 10 parts by weight as a solid of a melamine resin (tradename, YUBAN 20 SB, produced by Mitsui Toatsu Kagaku Co.), 2 parts by weight of a latent epoxy resin curing agent (dicyandiamide, reagent) which was added in the form of a dimethylformamide solution of 25 wt. % of a solid, and 0.5 parts by weight of a cure accelerating agent (tradename, CURE SOL 2E4MZ, produced by Shikoku Kasei Co.), thereby to prepare a resin varnish containing 25 wt. % as solids.

The thus prepared resin varnish was coated on the toughened face of 35 μm-thick electrolytic copper foils, air-dried and then heated at 150° C. for 7 minutes thereby to obtain semi-cured insulating layer-applied copper foils. The insulating layers so obtained at this point was each 100 μm in thickness.

(3) Preparation of a multiple printed wiring board

Both the faces of the inner-layer member prepared at the above step (1) were washed with purified water, the insulating layer-applied copper foils prepared at the above step (2) were placed respectively on both the washed faces with the insulating layer side of the insulating layer-applied copper foil facing to said washed face, thereafter the whole was pressed together at 30 kg/cm$^2$ and 170° C. for 60 minutes to form outer-layer members respectively on both the faces of the inner-layer member, masking predetermined portions of both the faces (copper foils) of the outer-layer member formed at the above step (3), and then the masked faces (copper foils) of the outer-layer member were etched by an ordinary method to form outer-layer circuits, thereby to prepare a multilayer (4 layers in this case) printed wiring board as shown in FIG. 1.

EXAMPLE 2

The procedure of Example 1 was followed except that 20 parts by weight of a rubber-modified epoxy resin (tradename, SUMIEPOXY ESC-500, produced by Sumitomo Kagaku Co.) were substituted for 20 parts by weight of the rubber-modified epoxy resin (tradename, EPO-TOHTO YR-102, produced by Tohto Kasei Co.) used at the above step (2), thereby to prepare a multilayer (4-layer) printed wiring board.

EXAMPLE 3

The procedure of Example 1 was followed except that a urethane resin (tradename, COLONATE AP-Stable, produced by Nippon Polyurethane Co.) was substituted in the same amount as a solid (10 parts by weight) for the melamine resin (tradename, YUBAN, produced by Mitsui Toatsu Kagaku Co.), thereby to prepare a multilayer (4-layer) printed wiring board.

COMPARATIVE EXAMPLE 1

The procedure of Example 1 was followed except that 35 μm-thick, surface-roughened electrolytic copper foils were substituted for the insulating layer-applied copper foils used in Example 1 and commercial available 0.1 mm-thick epoxy resin-impregnated glass cloth prepregs were used as insulating layers, thereby to prepare a multilayer (4-layer) printed wiring board.

COMPARATIVE EXAMPLE 2

The procedure of Example 1 was followed except that the same copper foils and prepregs as used in Comparative Example were used, and, before the multilayer formation of an inner-layer member used, the surface of the inner-layer circuits (copper foils) was treated with a solution containing 31 g/l of sodium hydrochlorite, 15 g/l of sodium hydroxide and 12 g/l of trisodium phosphate, at 85° C. under agitation for 3 minutes thereby to effect a black oxide treatment, thus preparing a multilayer (4-layer) printed wiring board.

COMPARATIVE EXAMPLE 3

The procedure of Example 1 was followed except there was used a resin varnish prepared by substituting an epoxy resin (tradename, EPOTOHTO YD-128, produced by Tohto Kasei Co.) for the rubber-modified epoxy resin (tradename, EPOTOHTO YR-102, produced by Tohto Kasei Co.) used as one ingredient of the insulating layer prepared at the aforementioned step (2) of Example 1, thereby to prepare a multilayer (4-layer) printed wiring board.

COMPARATIVE EXAMPLE 4

The procedure of Example 1 was followed except that there was used a resin varnish having a solid content of 48 wt. % and containing 70 parts by weight of an epoxy resin (tradename, EPOMIC R-301, produced by Mitsui Petrochemicals Co.), 20 parts by weight of a rubber-modified epoxy resin (tradename, EPOTOHTO YR-102, produced by Tohto Kasei Co.) and 10 parts by weight of a polyvinyl acetal resin (tradename, DENKA BUTYRAL No.5000A, produced by Denki Kagaku Kogyo Co.), the above resins being the same as those used as the ingredients of the insulating layer prepared at the step (2) of Example 1, thereby to prepare a multilayer (4-layer) printed wiring board.

The multilayer printed wiring boards (the laminates) obtained in Examples 1–3 and Comparative Examples 1–4 were evaluated for the following performances and properties. The results are as shown in Table 1.

1. Normal-state peeling strength between the copper foil on the surface of the inner-layer member and the insulating layer.
   In accordance with JIS C 6481
2. Solder heat resistance
   In accordance with JIS C 6481
3. Surface resistance
   In accordance with JIS C 6481
4. Haloing resistance
   The boards are each perforated to make a 0.4 mm φ through hole, and the perforated boards are each immersed in a 1:1 aqueous solution of hydrochloric acid at room temperature to visually determine whether having occurs or not.
5. Moistureproofing
   The boards are boiled in purified water for 2 hours and then immersed in a solder bath at 260° C. for 30 seconds to visually determine whether swelling occurs or not.
6. Thickness of insulating layer before or after pressed
   Thickness found

TABLE 1

| Ex. and Comp. Ex. | Pealing strength (Kgf/cm) | Solder heat resistance (sec) | Surface resistance (Ω) | Haloing resistance #1 | Moisture-proofing #2 | Thickness of insulating layer before or after pressed (μm) |
| --- | --- | --- | --- | --- | --- | --- |
| Ex. 1 | 1.31 | more than 120 | $6 \times 10^{14}$ | o | o | 100/95 |
| Ex. 2 | 1.28 | more than 120 | $5 \times 10^{13}$ | o | o | 100/90 |
| Ex. 3 | 1.55 | more than 120 | $7 \times 10^{15}$ | o | o | 100/95 |

TABLE 1-continued

| Ex. and Comp. Ex. | Pealing strength (Kgf/cm) | Solder heat resistance (sec) | Surface resistance ($\Omega$) | Haloing resistance #1 | Moisture-proofing #2 | Thickness of insulating layer before or after pressed (μm) |
|---|---|---|---|---|---|---|
| Comp. Ex. 1 | 0.26 | 60 | $1 \times 10^{15}$ | o | x | 100/90 |
| Comp. Ex. 2 | 1.35 | more than 120 | $1 \times 10^{15}$ | x | o | 100/90 |
| Comp. Ex. 3 | 0.72 | more than 120 | $9 \times 10^{14}$ | o | o | 100/70 |
| Comp. Ex. 4 | 0.62 | more than 120 | $8 \times 10^{14}$ | o | o | 100/20 |

1; o: No haloing x: Haloing occurred
2; o: No swelling x: Swelling occurred

It is apparent from Table 1 that the multilayer printed wiring board exhibits performances and properties equal to those of a conventional one even if the former is not subjected to black oxide treatment, and, further, problems as to the black oxide treatment are avoided.

This invention enables the black oxide treatment to be dispensed with in the preparation of a multilayer printed wiring board and also enables various problems raised by the black oxide treatment to be eliminated. In addition, the multilayer printed wiring board of this invention is comperable to a conventional one in performances and will not raise any problems as to surface smoothness and migration. Further, the insulating layer used in this invention is uniform and does not need a protective film. Thus, in a case where, the insulating layer is used in the preparation of an insulating layer-applied copper foil, the layer-applied copper foil so prepared will be satisfactorily easily handled and operated.

What is claimed is:

1. A process for the preparation of a multilayer printed wiring board comprising:

(1) a step of adhering copper foils respectively to both the faces of a substrate, masking said copper foils at their predetermined portions and then etching the partly masked copper foils to form circuits, (2) a step of applying copper foils having a semi-cured insulating layer formed on one face of the copper foils respectively to said circuits formed on both the faces of the substrate with the insulating layer facing to said circuit and then pressing the whole together under heat, the insulating layer comprising 40–70 wt. % of an epoxy resin, 20–50 wt. % of a polyvinyl acetal resin and 0.1–20 wt. % of a melamine resin or urethane resin, each based on the total of the resin ingredients, with the proviso that 50 wt. % of said epoxy resin is a rubber-modified resin, thereby to cure the insulating layers and simultaneously laminate these layers with said substrate having the circuits respectively on both the faces thereof and (3) a step of masking predermined portions of the copper foils respectively laminated via the insulating layers with said circuits and then etching the partly masked copper foils to form circuits respectively on the insulating layers.

2. A process according to claim 1, further comprising repeating said steps (2) and (3) as many times as desired.

* * * * *